(12) United States Patent
Liang et al.

(10) Patent No.: US 7,786,770 B1
(45) Date of Patent: Aug. 31, 2010

(54) REDUCING POWER CONSUMPTION BY DISABLING POWER-ON RESET CIRCUITS AFTER POWER UP

(75) Inventors: Gwen G. Liang, Palo Alto, CA (US); William Bradley Vest, San Jose, CA (US)

(73) Assignee: Altera Corporation, San Jose, CA (US)

( * ) Notice: Subject to any disclaimer, the term of this patent is extended or adjusted under 35 U.S.C. 154(b) by 4 days.

(21) Appl. No.: 12/241,373

(22) Filed: Sep. 30, 2008

(51) Int. Cl.
*H03K 17/22* (2006.01)
(52) U.S. Cl. .................................. 327/143; 327/198
(58) Field of Classification Search ................. 327/143, 327/198
See application file for complete search history.

(56) References Cited

U.S. PATENT DOCUMENTS

| | | | | |
|---|---|---|---|---|
| 5,166,545 A * | 11/1992 | Harrington | .................. | 327/143 |
| 5,619,156 A * | 4/1997 | Jandu | .......................... | 327/198 |
| 5,734,280 A * | 3/1998 | Sato | ............................ | 327/143 |
| 5,809,312 A * | 9/1998 | Ansel et al. | ................. | 713/300 |
| 6,144,237 A * | 11/2000 | Ikezaki | ........................ | 327/143 |
| 6,646,844 B1 * | 11/2003 | Matthews | ..................... | 361/78 |
| 6,690,220 B2 * | 2/2004 | Kuboshima et al. | ......... | 327/198 |
| 6,744,291 B2 * | 6/2004 | Payne et al. | .................. | 327/143 |
| 6,744,295 B2 * | 6/2004 | Miyagi | ........................ | 327/217 |
| 6,809,565 B2 * | 10/2004 | Kawakubo | .................... | 327/143 |
| 7,545,186 B2 * | 6/2009 | Suzuki et al. | ............... | 327/143 |
| 2007/0001721 A1 * | 1/2007 | Chen et al. | ................... | 327/143 |
| 2007/0150770 A1 * | 6/2007 | Lee | ............................. | 713/323 |

* cited by examiner

*Primary Examiner*—Lincoln Donovan
*Assistant Examiner*—Thomas J Hiltunen
(74) *Attorney, Agent, or Firm*—Martine Penilla & Gencarella, LLP

(57) ABSTRACT

Circuits and methods for reducing power consumption in an Integrated Circuit (IC) are provided. In one embodiment, a circuit includes a POR system control circuit, a POR latch and a control block circuit. The POR system control circuit generates a pulse during power up which is sent to the POR latch to set the state of the POR latch to a first logic state. The state of the POR latch is used to enable POR circuits during power up. The control block generates an output to disable POR circuits in the IC based on the state of the POR latch. After power-up, the state of the POR latch is set to a second logic state in order to disable the POR circuits resulting in power savings in the IC by eliminating static POR circuit current.

23 Claims, 4 Drawing Sheets

REDUCING POWER CONSUMPTION BY DISABLING POWER-ON RESET CIRCUITS AFTER POWER UP

BACKGROUND

The present invention relates to circuits and methods for reducing power consumption in integrated circuits (IC), and more particularly, circuits and methods for reducing power consumption in Power-On Reset (POR) circuits in the IC.

A POR circuit detects the power applied to an IC and generates a reset impulse that goes to different parts of the IC to place the IC into a known state. An IC can have multiple POR circuits with slightly different functions, where the multiple POR circuits are connected to different areas of the IC.

In addition, an IC with multiple power supplies requires different POR circuits to monitor each of the power supplies. Typical POR circuits consume static DC (Direct Current) power, even though they are active only during the reset phase. POR circuits include circuits that use the output from a bandgap bias generation circuit as a reference voltage or as a voltage level sensor, and circuits using the transistor threshold voltage as a reference voltage or as a voltage level sensor. The POR circuits stay powered, even after the POR sequence ends, draining power although the POR circuits serve no useful purpose during the normal operation of the IC. This situation can change if the power supply drifts below a given threshold, because the IC will restart the power up sequence, thus reactivating the different POR circuits.

The continuous power drainage by POR circuits poses a problem for low-power designs. It is in this context that embodiments of the invention arise.

SUMMARY

Embodiments of the present invention provide circuits and methods for reducing power consumption in an Integrated Circuit. In one embodiment, a circuit includes a POR system control circuit, a POR latch and a control block circuit. The POR system control circuit generates a pulse during power up which is sent to the POR latch to set the state of the POR latch to logic high. The state of the POR latch is configured to enable POR circuits during power up. The control block generates an output to disable POR circuits in the IC based on the state of the POR latch. After power-up, the state of the POR latch is set to logic low in order to disable the POR circuits, resulting in power savings in the IC by eliminating static POR circuit current.

It should be appreciated that the present invention can be implemented in numerous ways, such as a process, an apparatus, a system, a device or a method on a computer readable medium. Several inventive embodiments of the present invention are described below.

In one embodiment, a method for reducing power consumption in an IC sets a latched POR signal to a first logic state during power up. Further, the method performs power-on sequences by POR circuits, and latches the latched POR signal to a second logic state. The method continues by disabling the POR circuits based on the latched POR signal.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which.

DETAILED DESCRIPTION

Typically, IC's keep all the POR circuits enabled after the power up sequence ends. Because the POR circuits are always enabled, a significant amount of DC power is consumed by the POR circuits while the IC is powered up. This power consumption can be critical in circuits that require low-power consumption, such as cell phones, Personal Digital Assistants (PDA), handheld computers, etc.

In one embodiment, circuitry in an IC controls the operation of POR circuits. POR circuits are active during the power-up of the IC, as in a typical operation of POR circuits, but once the POR sequence is over, the POR circuits are disabled. Once the POR circuits are disabled, the POR circuits no longer consume DC power, resulting in reduced power consumption in the IC. The added circuitry consumes a small amount of DC power, but the consumption of the added circuitry is several orders of magnitude less than the consumption of the POR circuits when always enabled.

The following embodiments describe circuits and methods for reducing power consumption in an Integrated Circuit (IC). In one embodiment, a low power POR system control circuit generates a pulsed signal to enable all the POR circuits during power up, while consuming a small amount of DC current. The control signal generated by the POR system control circuit, with additional supporting logic, is used to control the POR system by enabling POR circuits during power up, and then disabling the POR circuits after the power-up sequence is finished. The circuit also includes a POR latch and a control block circuit. The pulse generated by the POR system control circuit is sent to the POR latch to set the state of the POR latch to logic high. The state of the POR latch is used to enable POR circuits during power up. The control block generates an output to disable POR circuits in the IC based on the state of the POR latch and the operating mode of the IC. After power-up, the state of the POR latch is set to logic low in order to disable the POR circuits resulting in power savings in the IC by eliminating static POR circuit current.

It will be obvious, however, to one skilled in the art, that the present invention may be practiced without some or all of these specific details. In other instances, well known process operations have not been described in detail in order not to unnecessarily obscure the present invention.

Figure 1:
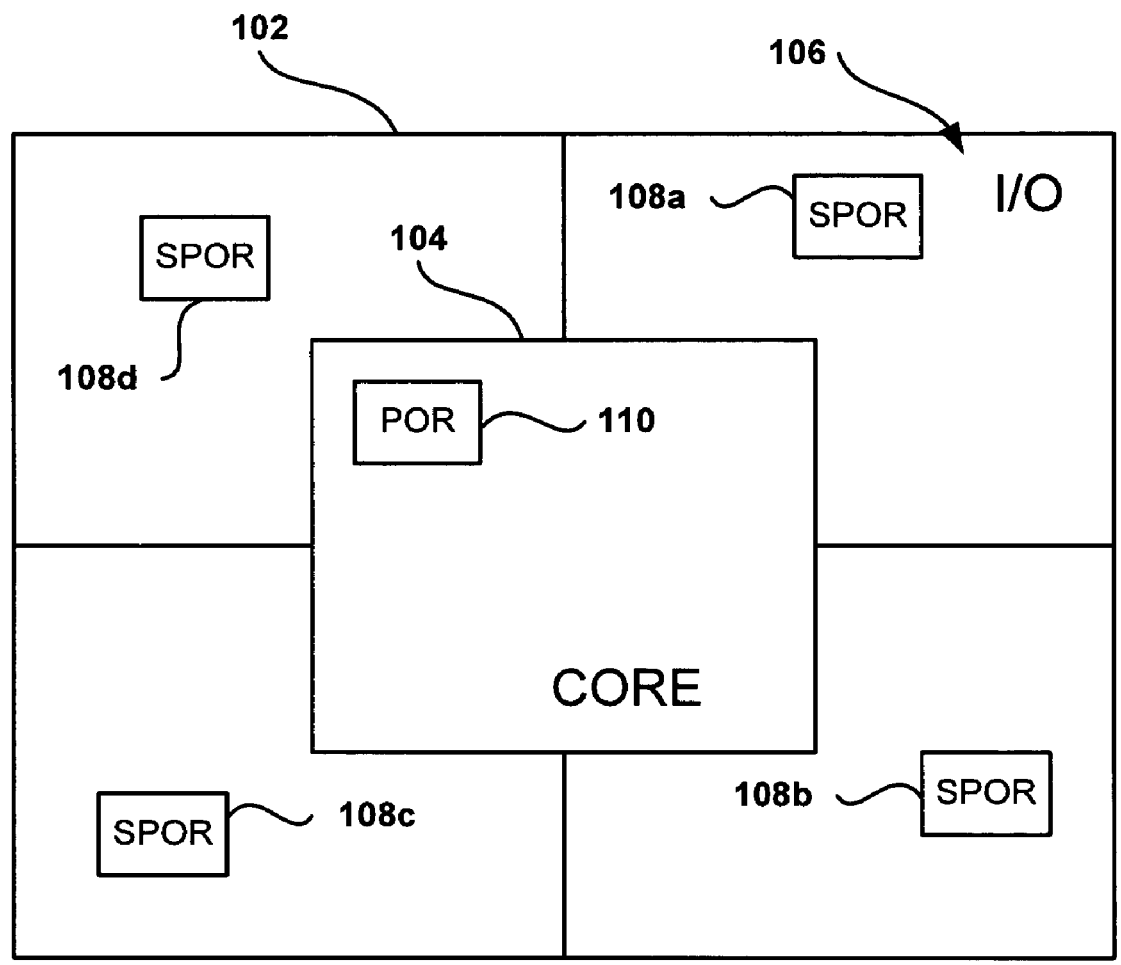
FIG. 1 depicts the location of POR circuits in an IC in one embodiment of the invention.

FIG. 1 depicts the location of POR circuits in IC 102 in one embodiment of the invention. IC 102 includes core area 104 and Input/Output (I/O) area 106, which is divided in four different blocks. While IC 102 has four different I/O areas in the IC of FIG. 1, other configurations are possible with different number of I/O blocks, such as 1, 2, 8, etc. POR 110 and SPOR (Satellite POR) 108*a-d* circuits are different types of Power-on Reset detection circuits used to monitor power supplies. POR circuits monitor Vcc, while SPOR circuits monitor VCCN1 and VCCN2, two different power supplies used by the I/O subsystem. For simplicity, only a few POR circuits are shown in IC 102, but multiple POR circuits can be distributed along the core and the I/O ring to monitor different power supplies, different blocks in the IC, and different circuits.

POR circuit 110 can be one of a variety of different types of POR circuits, or a combination of POR circuits, such as VTPOR (VT POR, where VT is the transistor threshold voltage) and BGPOR (BandGap POR). VTPOR circuits use the transistor threshold voltage as a reference, comparing the threshold voltage to the power supply voltage level, in order to signal other circuits when the power supply voltage level has reached the transistor threshold voltage during power up. Similarly, BGPOR circuits monitor the power supply voltage using as reference the voltage created by bandgap circuits. It should be appreciated that FIG. 1 is an exemplary diagram for illustrating distribution of POR circuits on an IC, and is not meant to be limiting.

Figure 2:
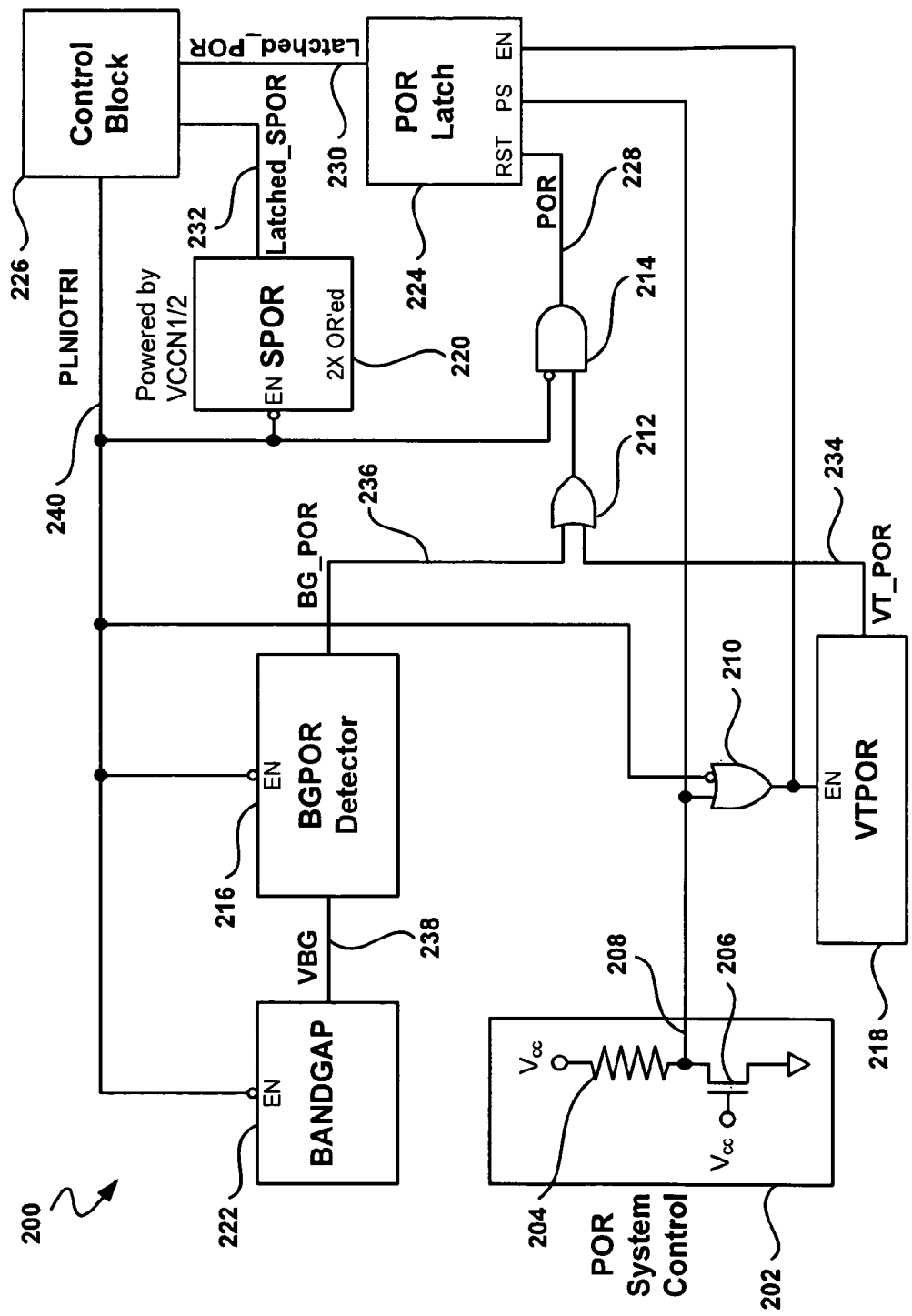
FIG. 2 shows a diagram of a circuit for disabling POR circuits after the power-up sequence, according to one embodiment.

FIG. 2 shows a diagram of circuit 200 for disabling POR circuits after the power-up sequence, according to one embodiment. Circuit 200 includes three POR circuits, BGPOR 216, SPOR 220 and VTPOR 218. VTPOR circuit 218 monitors the power supply voltage using the transistor threshold voltage as reference, as previously described, and generates VT_POR 234 output signal, which is logic high (1) during power-up and logic low (0) otherwise. BGPOR circuit 216 monitors the power supply voltage using bandgap voltage and receives bandgap voltage VBG 238 generated by the BANDGAP circuit 222. The output of BGPOR 216 is a BG_POR signal 236 that is set to logic high during the BGPOR initialization sequence and to logic low otherwise.

SPOR circuit 220 is used for POR functions of the 10 blocks and generates the latched_SPOR signal 232, which is similar to the latched_POR signal 230. Latched_SPOR 232 is also permanently set after power up, and indicates that the I/O block is ready. In one embodiment, SPOR 220 is powered by signal VCCN1, VCCN2, etc. VCCN1, VCCN2 are power supplies for the IO regions of the device.

POR system control circuit 202 senses when the IC is powering up and generates POR system control signal 208 to enable the POR system during power up. POR system control circuit 202 consumes very low DC current. In one embodiment, the power consumption of one IC was reduced from tens of mili-Amps, to less than 30 µA when using the POR circuit described herein. POR system control signal 208, together with supporting logic (logic gates 210, 212 and 214, as well as control block 226), enables the POR system during power up. After power up is finished successfully and the device enters user mode, all the POR circuits are disabled to eliminate DC power consumption in POR circuits.

POR system control circuit 202 includes NMOS transistor 206 and resistor 204. Other embodiments use similar circuits confirming to the basic principles of the invention. Resistor 204 is connected to $V_{cc}$ and a terminal of transistor 206. The gate of NMOS transistor 206 is connected to $V_{cc}$ and the other terminals to resistor 204 and ground. During power up, $V_{cc}$ starts growing and POR system control signal 208 also grows because transistor 206 is off and resistor 204 is connected to $V_{cc}$. Once Vcc level reaches the transistor threshold voltage level, transistor 206 will be turned on, causing the output of POR System Control circuit 208 to go back to logic low, thereby causing the end of the pulse generated at output 208.

POR system control signal 208 is inputted to POR latch 224 to preset latched_POR signal 230 to a logic high value (1) during power up and ensure the correct initialization of POR signal 228. Once the power up sequence is finished, POR signal 228 switches to a logic low value (0), retaining this value as long as $V_{cc}$ stays within operating range. The person skilled in the art will readily appreciate that other embodiments of the invention use different logic values and different logic gates while maintaining the same principles of operation described with respect to circuit 200.

Logic OR gate 210 receives inputs from POR system control signal 208 and PLNIOTRI signal 240, described below. The output of logic OR gate 210 is used to enable VTPOR circuit 218 and POR Latch 224. VTPOR 218 will start working earlier than BGPOR 216 due to the different characteristics of the circuits, and generates a logic low VT_POR signal at various Vcc supply voltage levels, depending on ambient temperature and silicon material process distribution (fast vs. slow material, etc). BGPOR will generate a logic low BG_POR signal at a precise Vcc voltage level independent of the environmental factors. The combination of these two types of POR circuits ensures a precise Vcc supply level detection circuits with a wide functional range.

POR latch 224 is preset to logic high because POR latch 224 receives in the Preset (PS) input the pulse coming from POR system control signal 208. The POR latch enable input (EN), connected to the output of logic OR gate 210, enables the POR latch circuit contemporaneously with VTPOR 218. POR signal 228, feeding into POR latch 224, will only reset the POR latch to logic low when POR signal 228 goes to logic low at the end of the power up sequence. POR signal 228 has no effect on POR latch 224 when POR signal 228 is at logic high. If control block 226 enters configuration mode later on, POR latch 224 will not be preset to logic high again because of the circuitry including logic gates 212 and 214. If control block 226 enters configuration mode, and in the case where $V_{cc}$ drops below a threshold level, a new POR signal 228 will be generated, but latched_POR will forever stay latched to logic low after the initial period. As a result, the designer must design a board or system that avoids drifting $V_{cc}$ supply to the IC below the threshold level or the IC will not be operate properly.

In another embodiment, the power-up sequence is restarted from the beginning if $V_{cc}$ drifts below a threshold level, allowing the different POR circuits to be enabled once again, to be later disabled after POR is complete.

Control block circuit 226 receives as inputs latched_POR 230 and latched_SPOR 232 signals, indicative that the circuit is powering up. Control block 226 outputs PLNIOTRI signal 240, which is set initially to logic low (0) during IC configuration mode, and later set to logic high (1) when the IC starts operating in user mode (after the POR sequence has also finished). PLNIOTRI 240 is used to disable the POR circuits and Bandgap circuit 222 after power up. PLNIOTRI 240 is connected to VTPOR 218 through logic OR gate 210, thus enabling VTPOR 218 circuit to be initially enabled via POR system control signal 208. PLNIOTRI 240 is also used by the circuitry including logic gates 212 and 214 to set POR signal 228 feeding POR Latch 224. All DC currents in POR circuit components are eliminated after power up, except for POR system control circuit 202, thus achieving very low static power consumption in user mode.

Both BG_POR 236 and VT_POR 234 have to finish their initialization sequence before POR signal 228 becomes logic low. In one embodiment, VT_POR 234 becomes logic low earlier or, in other words, released earlier than BG_POR 236, the release point varying depending on the silicon. In one embodiment, BG_POR 236 starts working at a higher $V_{cc}$, but the releasing point is almost fixed, independent of the type of silicon and independent of ambient conditions, such as temperature variation. Logic gate 212 combines VT_POR 234 and BG_POR 236 to set POR 228 to logic high (1) if either VT_POR 234 or BG_POR 236 are at Logic high (1). By combining VT_POR 234 and BG_POR 236, POR 228 generated is active at a low $V_{cc}$ level and gets released at an exact $V_{cc}$ level.

Logic gate 214 combines the output of logic gate 212 with PLNIOTRI 240 (initially set to 0) to output POR signal 228. This guarantees that once PLNIOTRI 240 is set to logic high (1) after the configuration phase, POR signal 228 is permanently set to logic low (0) while in user mode.

Figure 3:
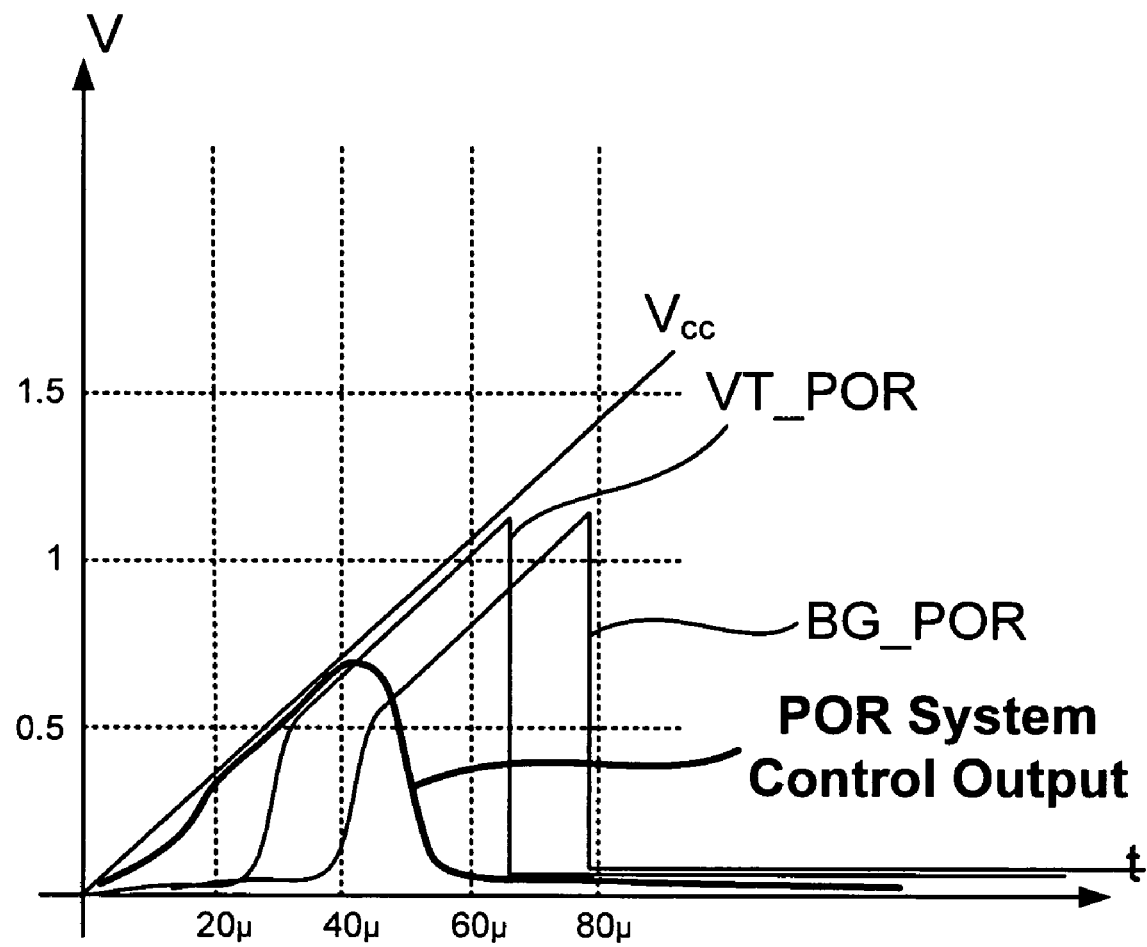
FIG. 3 shows an exemplary evolution of POR signals during power-up.

FIG. 3 shows an exemplary evolution of POR signals during power-up. After the IC is powered, the $V_{cc}$ voltage will start growing until $V_{cc}$ reaches $V_{cc}$'s nominal value. The output of the POR system control circuit will be a pulse, as previously discussed. The pulse generated by the POR system control circuit will enable the VTPOR circuit. VT_POR will continue growing until $V_{cc}$ reaches the transistor threshold value, at which point, the VT_POR signal will be released to 0. BG_POR is similar to VT_POR but starts working later than VT_POR, and BG_POR gets released later at a fixed voltage level independent of silicon and ambient.

Figure 4:
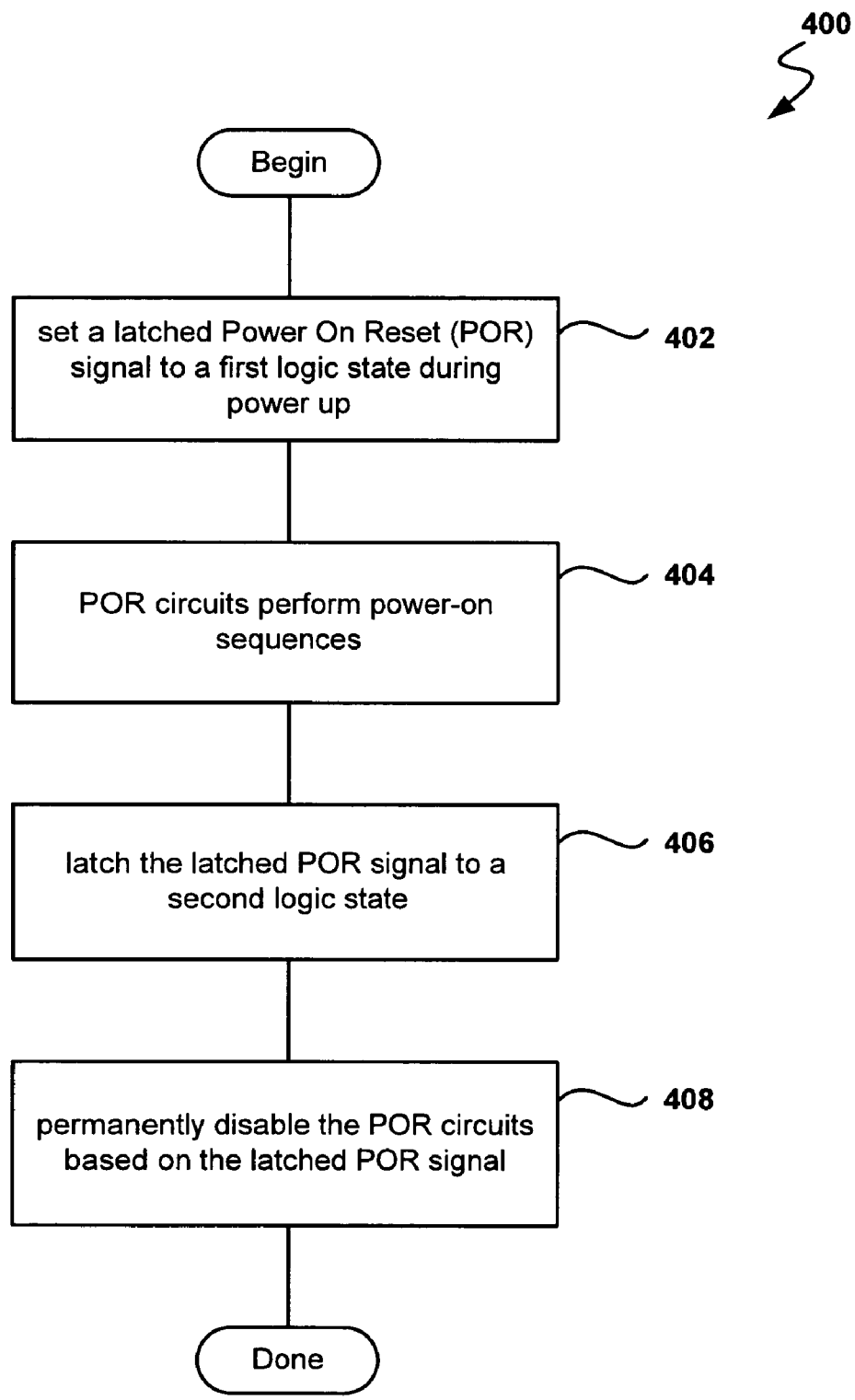
FIG. 4 shows a process flow for disabling POR circuits after the power-up sequence, in accordance with one embodiment of the invention.

FIG. 4 shows a process flow 400 for disabling POR circuits after the power-up sequence, in accordance with one embodiment of the invention. In operation 402, the method sets a latched POR signal to a first logic state during power up, such as latched_POR from FIG. 3. The method, in operation 404, performs power-on sequences by the POR circuits. In operation 406, the latched POR signal is latched to a second logic state. In one embodiment, the signal is latched to low by using the POR latch of FIG. 3. The method further includes operation 408 where the POR circuits are disabled based on the latched POR signal and associated supporting logic. In one embodiment, control block 226 of FIG. 3 generates output PLNIOTRI 240, connected to the enable inputs (EN) of POR circuits 216, 220 and 218, to achieve the disabling of the POR circuits.

The circuits and methods for reducing power consumption in an IC, described herein may be incorporated into any suitable integrated circuit. For example, the circuits and methods may be incorporated into other types of programmable logic devices such as programmable array logic (PAL), programmable logic array (PLA), field programmable logic array (FPLA), electrically programmable logic devices (EPLD), electrically erasable programmable logic device (EEPLD), logic cell array (LCA), just to name a few. The programmable logic device may be a part of a data processing system that includes one or more of the following components: a processor, memory; I/O circuitry, and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

Embodiments of the present invention may be practiced with various computer system configurations including handheld devices, microprocessor systems, microprocessor-based or programmable consumer electronics, minicomputers, mainframe computers and the like. The invention can also be practiced in distributed computing environments where tasks are performed by remote processing devices that are linked through a wire-based or wireless network.

With the above embodiments in mind, it should be understood that the invention can employ various computer-implemented operations involving data stored in computer systems. These operations are those requiring physical manipulation of physical quantities. Usually, though not necessarily, these quantities take the form of electrical or magnetic signals capable of being stored, transferred, combined, compared and otherwise manipulated.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for reducing power consumption in an Integrated Circuit (IC), the method comprising:
setting a latched Power On Reset (POR) signal to a first logic state;
performing power-on sequences by POR circuits that detect when power is applied to the IC;
latching, in a latch circuit external to the POR circuits, the latched POR signal to a second logic state after the power-on sequences; and
disabling the POR circuits in response to the latching.

2. The method of claim 1, wherein setting a latched POR signal further includes,
generating a pulse during power-on to set the latch circuit to the first logic state, the latch circuit storing the latched POR signal.

3. The method of claim 2, wherein latching the latched POR signal further includes, combining POR signals from the POR circuits to set the latch circuit to the second logic state.

4. The method of claim 3, further including,
starting a configuration phase of the IC after latching the latched POR signal to the second logic state.

5. The method of claim 2, wherein the POR circuits include,
a transistor threshold voltage POR (VTPOR) circuit using transistor threshold voltage as reference voltage,
a bandgap POR (BGPOR) circuit using as reference voltage an output of a bandgap circuit in the IC, and
a satellite POR (SPOR) circuit associated with Input/Output (I/O) circuits.

6. The method of claim 5, wherein the VTPOR circuit receives the pulse during power-on.

7. A circuit for reducing power consumption in an IC, the circuit comprising:
a POR system control circuit that generates a pulse during power up;
a POR latch that receives the pulse to set a POR latch state to a first logic state, the POR latch state being used to enable POR circuits during power up, the POR latch being external to the POR circuits, the POR circuits detecting when power is applied to the IC; and
a control block with a disable output for disabling POR circuits based on the POR latch state and supporting logic after the POR circuits initial power up sequence.

8. The circuit of claim 7, wherein the disable output is connected to enable inputs in the POR circuits for enabling or disabling the POR circuits.

9. The circuit of claim 7, further including,
a combinatorial logic circuit that combines a plurality of POR outputs from the POR circuits with the disable output to reset the POR latch to a second logic state.

10. The circuit of claim 9, wherein the POR circuits include,
a transistor threshold voltage POR (VTPOR) circuit,
a bandgap POR (BGPOR) circuit associated with bandgap circuits in the IC, and
a satellite POR (SPOR) circuit associated with Input/Output (I/O) circuits.

11. The circuit of claim 10, further including,
a logic OR gate, the inputs of the logic OR gate being a line carrying the pulse and an inverse of the disable output, the output of the logic OR gate being connected to the enable input of the VTPOR circuit,
wherein the VTPOR circuit is activated earlier than other POR circuits.

12. The circuit of claim 10, wherein the SPOR circuit outputs a latched SPOR line in electrical communication with the control block.

13. The circuit of claim 10, wherein the combinatorial logic circuit sets the POR latch state to the second logic state when POR outputs from VTPOR and BGPOR are both at the second logic state or when the disable output is at the first logic state.

14. The circuit of claim 7, wherein the POR system control circuit includes,
a resistor connected to power, and
an NMOS transistor whose gate is connected to power, a terminal of the NMOS transistor being connected to the resistor and the other terminal to ground.

15. A circuit for reducing power consumption in an IC, the circuit comprising:
a POR system control circuit that senses when the IC is powered up; and a POR latch that stores a POR latch state that is preset by the POR system control to a first logic state during power up sequence, the POR latch state being used to enable POR circuits during the power up sequence and being set to a second logic state after the power up sequence, the POR latch being external to the POR circuits, the POR circuits detecting when power is applied to the IC.

16. The circuit of claim 15, further including,
a control block that receives the POR latch state and generates a disable output for disabling POR circuits, the disable output being set to the first logic state when the POR latch state is at the second logic state and the IC has finished an IC configuration sequence.

17. The circuit of claim 16, further including,
a VTPOR circuit including an enable input,
a logic OR gate whose output is connected to the VTPOR enable input, the inputs of the logic OR gate being the output of the POR system control circuit and a logical inverse of the disable output.

18. The circuit of claim 17, further including,
a BGPOR circuit that generates a BG_POR output during BGPOR power up sequence, the BG_POR output being used to reset the POR latch state, and
a bandgap circuit connected to the BGPOR circuit.

19. The circuit of claim 18, further including,
logic circuitry for resetting the POR latch state to the second logic state when POR outputs from VTPOR and BGPOR are both at the second logic state or when the disable output is at a first logic state.

20. The circuit of claim 16, further including,
a satellite POR (SPOR) circuit associated with Input/Output (I/O) circuits, the SPOR circuit generating a latched SPOR output used by the control block to generate the disable output.

21. A method for reducing power consumption in an Integrated Circuit (IC), the method comprising:
setting a latched Power On Reset (POR) signal to a first logic state, wherein setting the latched POR signal further includes generating a pulse during power-on to set a latch circuit to the first logic state, the latch circuit storing the latched POR signal;
performing power-on sequences by POR circuits;
latching the latched POR signal to a second logic state after the power-on sequences, wherein latching the latched POR signal further includes combining POR signals from the POR circuits to set the latch circuit to the second logic state; and
disabling the POR circuits in response to the latching.

22. A method for reducing power consumption in an Integrated Circuit (IC), the method comprising:
setting a latched Power On Reset (POR) signal to a first logic state;
performing power-on sequences by POR circuits, wherein the POR circuits include,
a transistor threshold voltage POR (VTPOR) circuit using transistor threshold voltage as reference voltage,
a bandgap POR (BGPOR) circuit using as reference voltage an output of a bandgap circuit in the IC, and
a satellite POR (SPOR) circuit associated with Input/Output (I/O) circuits;

latching the latched POR signal to a second logic state after the power-on sequences; and disabling the POR circuits in response to the latching.

23. A circuit for reducing power consumption in an IC, the circuit comprising:

a POR system control circuit that generates a pulse during power up;

a POR latch that receives the pulse to set a POR latch state to a first logic state, the POR latch state being used to enable POR circuits during power up;

a control block with a disable output for disabling POR circuits based on the POR latch state and supporting logic after the POR circuits initial power up sequence; and a combinatorial logic circuit that combines a plurality of POR outputs from the POR circuits with the disable output to reset the POR latch to a second logic state.

* * * * *